United States Patent [19]

Fujii et al.

[11] Patent Number: 4,727,266

[45] Date of Patent: Feb. 23, 1988

[54] LSI GATE ARRAY HAVING REDUCED SWITCHING NOISE

[75] Inventors: Shigeru Fujii, Yokohama; Kouichi Yamashita, Machida; Tomoaki Tanabe, Yokohama; Yoshio Kuniyasu, Kawasaki, all of Japan

[73] Assignee: Fujitsu Limited, Kawasaki, Japan

[21] Appl. No.: 18,846

[22] Filed: Feb. 24, 1987

Related U.S. Application Data

[63] Continuation of Ser. No. 681,291, Dec. 13, 1984.

[30] Foreign Application Priority Data

Dec. 23, 1983 [JP] Japan ............................. 58-243432

[51] Int. Cl.$^4$ .................... H03K 17/16; H03K 19/003
[52] U.S. Cl. ................................. 307/443; 307/448;
307/451; 307/475; 307/577; 307/579; 307/591;
307/303
[58] Field of Search ................... 307/200 B, 443, 442,
307/450, 475, 481, 577, 579, 584–585, 591, 594,
596, 601, 605, 303, 304, 242, 451, 452

[56] References Cited

U.S. PATENT DOCUMENTS

| | | | |
|---|---|---|---|
| 3,983,619 | 10/1976 | Kubo et al. | 307/448 X |
| 4,272,830 | 6/1981 | Moench | 365/45 |
| 4,311,925 | 1/1982 | Chang et al. | 307/448 X |
| 4,394,588 | 7/1983 | Gaudenzi | 307/443 |
| 4,430,583 | 2/1984 | Shoji | 307/448 |
| 4,479,067 | 10/1984 | Fujita | 307/448 X |
| 4,504,959 | 3/1985 | Heckenbach | 307/475 X |

OTHER PUBLICATIONS

Mead and Conway, Introduction to VLSI Systems, Addison–Wesley Pub. Co., Reading, Mass., Oct. 1980, pp. 5–14.
Patent Abstracts of Japan, vol. 7, No. 136, JP–A–5-8-51536, Jun. 14, 1983.
Patent Abstracts of Japan, vol. 6, No. 251, JP–A–5-7-148363, Dec. 10, 1982.
Proceedings of the 2nd International Conference on Semi-Custom ICs, "Introduction of an Ultra Fast 8000-Gate CMOS Gate Array", Nov. 23–25, 1982, pp. 1–7.

*Primary Examiner*—John S. Heyman
*Assistant Examiner*—D. R. Hudspeth
*Attorney, Agent, or Firm*—Staas & Halsey

[57] ABSTRACT

As the number of output circuit increases in LSI or VLSI circuit, there increases the chance of many large output circuits operates at a same instant, and it causes malfunction of logic by induced switching noise. In order to prevent such problem, the switching speed of driving buffer circuit for output buffer circuit is controlled. By reducing the switching capacity of the driving circuit, the switching speed of the total circuit is not affected so much, but the noise is decreased very much. The control of the switching capacity of the driving buffer circuit is performed by master slice technology. Such as perfectly opposite design concept to that of present LSI design has been proofed by experiments.

5 Claims, 32 Drawing Figures

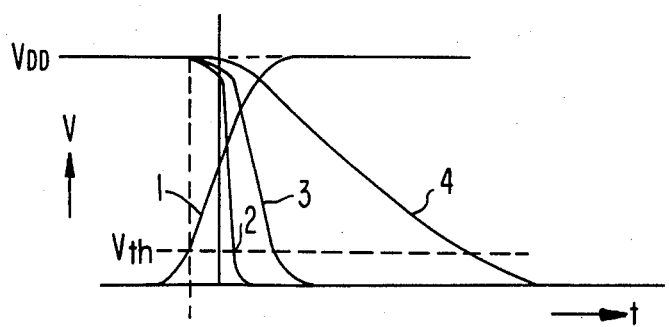
FIG. 6(a).
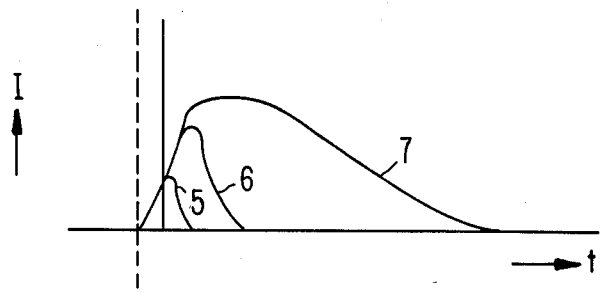
FIG. 6(b).
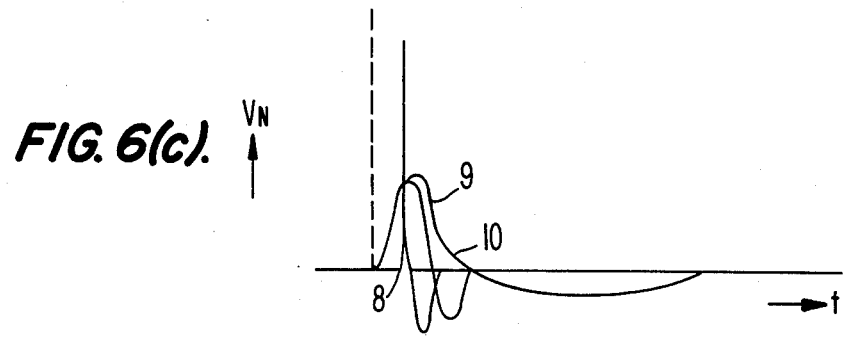
FIG. 6(c).
FIG. 7.
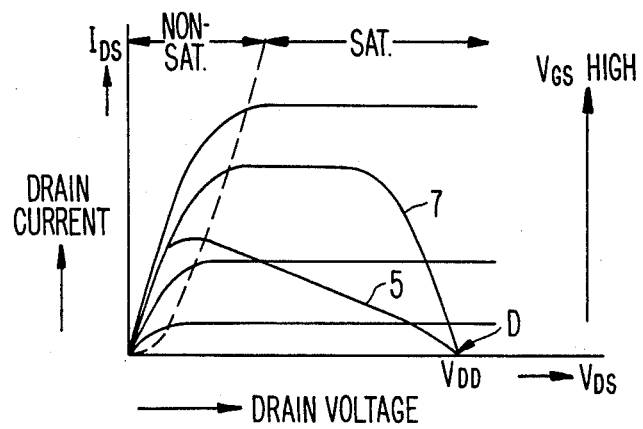

FIG. 10(a).
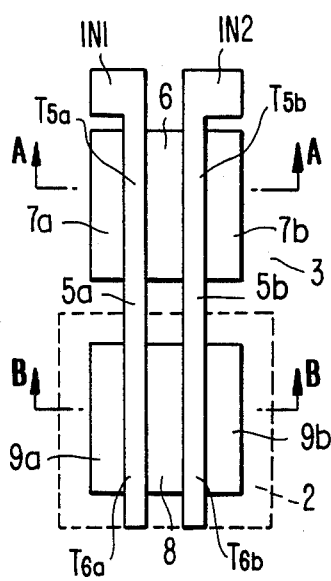
FIG. 11(a).
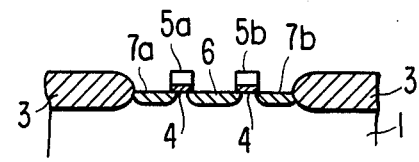
FIG. 11(b).
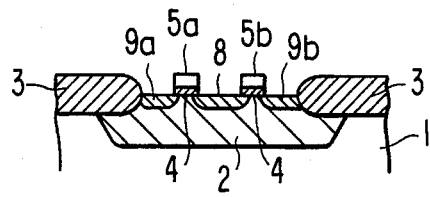
FIG. 11(c).
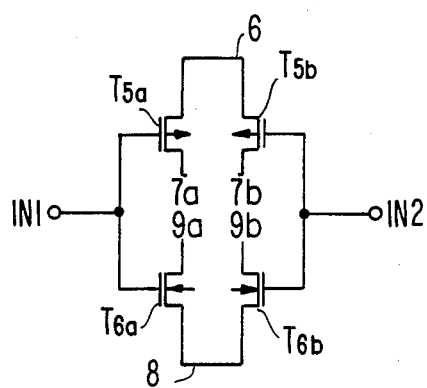
FIG. 11(d).

LSI GATE ARRAY HAVING REDUCED SWITCHING NOISE

This is a continuation of co-pending application Ser. No. 681,291 filed on Dec. 13, 1984.

BACKGROUND OF THE INVENTION

1. Field of the Invention

The present invention relates to a large scale integrated circuit (LSI) which includes gate array circuits comprising MIS (metal insulator semiconductor) or CMIS (complementary MIS) type FETs (field effect transistors), more particularly to its output buffer circuit. The present invention is intended to reduce a noise induced by variation of high current, or to stabilize a fluctuation of earth potential which are caused by switching of output buffer circuits.

2. Description of the Prior Art

General LSIs are provided with input buffer circuits (or level shifter) which equalize signal level of input signal to that of inner logic circuits, and output buffer circuits which drive outer circuits or equipments. Recently as the scale of integration in LSI becomes large, the gate number included in LSI is exceeding few tens of thousand gates per chip, and the output gate number also exceeded two hundreds. The output buffer circuit is required high switching speed and driving capacity in order to drive various kinds of external load. On the other hand there appeared another problem of noise, which is induced by high switching current of the output circuit. It is becoming a serious problem for LSI or VLSI (very large scale integration) circuits, of which main logic is designed to operate with very small current.

In order to render clearly apparent such situation and the advantage of the present invention, prior art output buffer circuit and its design concept will be described briefly. Circuit diagrams for some exemplary output gate circuits are shown in FIGS. 1 through 3. In which, FIG. 1 is a non-inverting output buffer circuit, FIG. 2 is an inverting output buffer circuit and FIG. 3 is a NAND type output buffer circuit exemplifying an output buffer circuit coupled with a NAND gate. Throughout the figure, (a) shows a symbol mark of the circuit and (b) shows inner connection of the gate circuit. In the figures IN designates input terminal which connects the gate circuit to the inner logic circuit, OUT is an output terminal, and $G_1$ is a driver gate for the output buffer gate circuit $G_2$. $V_{DD}$ is a high voltage source and $V_{SS}$ is a low voltage source (usually earth potential). As can be seen in the figures, the output buffer gate circuit $G_2$ consists of a complementary MOS (CMOS) circuit comprising p-channel MOS (p-MOS) FET $T_1$, and n-channel MOS (n-MOS) FET $T_2$.

Driving force or driving capacity of the output buffer circuit is determined by output impedance or mutual conductance gm of the CMOS FETs $T_1$ and $T_2$. Following relation is known in the art $$gm \propto \beta \propto W/L$$

where $\beta$ is current amplification factor of the transistor, W is gate width of the FET and L is gate length of the FET. Therefore, high driving capacity of the output buffer circuit is attained by shortening the gate length L and making W large that is elongating the transistor.

In prior art LSI the the ratios W/L of transistors for inner gate $G_0$, for driving gate $G_1$ and for output buffer gate $G_2$ are determined respectively as 1:3:10 or 1:5:20 for example, in the design stage of the LSI. These ratios were determined to minimize the chip area, or to minimize the switching time of the output buffer gates.

Recently there appeared some attempts to optimize the size of output buffer circuit and its driving stage. For example, Japanese Provisional Publication No. 57-148363 by K. Kinoshita (laid open on Sep. 9, 1982) or No. 58-127347 by S. Wakamatsu (laid open on Jul. 29, 1983) show some of them. They are attempting to optimize the output circuit introducing the idea of master slice technology, namely plurality of transistors (FET) having predetermined sizes (for example three kinds of sizes having the size ratio of 1:2:3) are fabricated at the I/O (input/output) circuit area of IC chip, and they are connected properly by wiring pattern.

FIG. 4 illustrates the outline of those attempts. In the figure, (a) shows a part of the I/O area which is generally located at the peripheral part of the chip. As shown in the figure, 11 are smallest size FETs, 12 are second size FETs whose size is twice of that of FETs 11, and 13 are largest FETs (tree times as large as Fets 11). And if two fun out circuit or three fun out circuit are required as shown in FIG. 4(b) or 4(c), proper size FETs are selected and connected each other as shown in the figure. For example, for a two fun out circuit the second size FET 15 is used to drive two small size FETs 14, and for a three fun our circuit the largest size FET 17 is used to drive three small FETs 14. In such a a manner, the decrease of switching speed is prevented.

As has been described before, prior art output gate circuits are designed to operate as fast as possible. The high speed and high driving capacity of the output buffer circuit is attained by increasing the switching current handled by output transistors. But high current switching has increased problem of induced noise, especially for very large scale integrated circuit (VLSI). The inner logic circuit, which is a main part of the logic circuit, is designed to work with a current as small as possible to prevent heat dissipation, but the output circuit cannot cut down the switching current to drive outer circuit which generally has large stray capacity. Moreover, as the number of output buffer circuit increases, there occurs a chance that several number of output circuits work at the same instant, so the multiplied switching current induces noise in the wiring lines or pins in the package, and causes malfunction of the main logic. This is becoming a serious problem for VLSI circuits.

The voltage fluctuation $V_N$ appears on the $V_{SS}$ line is given as $$V_N = RI + L[(dI)/(dt)]$$

where R is resistance of the wiring, L is inductance of the $V_{SS}$ line and I is the current flowing in the $V_{SS}$ line. This voltage fluctuation causes the noise and malfunction of the inner circuit. So, if the circuit is designed to have a large value of W/L in order to get high switching speed or high driving capacity, the current amplification factor $\beta$ becomes large. Since the current I is proportional to $\beta$, which is proportional to W/L.

There exists a trade off, therefore, between getting high speed switching or high driving capacity and decreasing switching noise. Especially it is serious for LSI or VLSI circuit, wherein many of the output buffer circuits have chance to work at the same time, and by the sum of the switching currents, noise is induced on the $V_{SS}$ line or on the $V_{DD}$ line which causes malfunction of the main logic circuit.

SUMMARY OF THE INVENTION

Object of the present invention, therefore, is to provide an output buffer circuit which has high switching speed and high driving capacity but still has low switching noise.

The inventors noticed that the switching time of the output buffer circuit is mainly determined by the switching speed of the output gate so long as the driving gate circuit has enough switching speed and driving capacity. On the other hand, the switching noise increases as I (current running through the circuit) and its time derivative dI/dt increase. Among of them, I is determined by outer load which the IC must drive, so it cannot be decreased. But dI/dt has some room for decreasing its value. Of course decrease of dI/dt increases the switching time but not so serious, on the other hand the switching noise is decreased drastically.

Such design concept of the output buffer circuit is perfectly contrary to that of prior design. Control of the dI/dt is difficult to perform in the output side of the output gate, because the load varies often. By the present invention, therefore, the control is done in the input side of the gate circuit. Namely the switching speed of the driving circuit is controlled applying the master slice technology.

The present invention utilizes the fact that the transient current which runs through a MIS FET depends on the wave form of its input signal and does not depend on the load capacitance. The gate size of the driving circuit (driver gate) is intentionally decreased, accordingly the input waveform to the output buffer gate circuit is properly blunted, then the output waveform is similarly blunted, and the transient current in the output circuit is decreased. Thus the switching noise is decreased. Though the output waveform is slightly blunted, the maximum current supplied by the output buffer circuit does not vary, so the driving capacity of the circuit does not vary. The control of the driver gate size is performed by master slice technology.

These together with other objects and advantages, which will be subsequently apparent, reside in the details of construction, as more fully hereinafter described and claimed, reference being had to the accompanying drawings forming a part hereof, wherein like numerals refer to like parts throughout.

BRIEF DESCRIPTION OF THE DRAWINGS

FIG. 6 shows voltage and current waveforms appearing at several points of the circuit of FIG. 5.

FIG. 7 shows characteristics of drain current vs drain voltage of MIS FET. (Prior art)

FIG. 11 illustrates construction of output buffer circuit embodying the present invention, wherein:
 (a) is a plan view of a CMIS FET pattern appearing on the chip before wiring:
 (b) shows a cross sectional view of the device along a line AA in FIG. 11(a):
 (c) shows a cross sectional view of the device along a line BB in FIG. 11(a); and
 (d) shows its equivalent circuit diagram.

DETAILED DESCRIPTION OF THE INVENTION

Figure 1A:
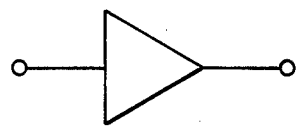
FIG. 1 is a symbolic diagram and circuit diagram of prior art exemplary non-inverting output buffer circuit.
Figure 1B:
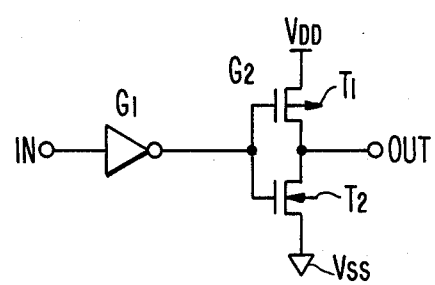
Figure 2A:
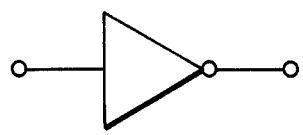
FIG. 2 is a symbolic diagram and circuit diagram of prior art exemplary inverting output buffer circuit.
Figure 2B:
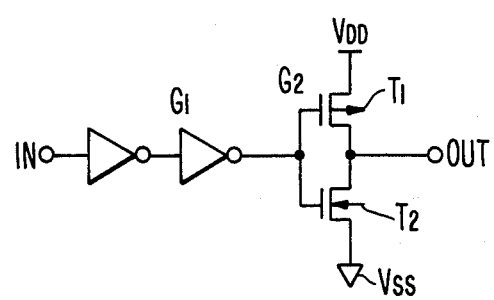
Figure 3A:
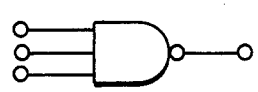
FIG. 3 is a symbolic diagram and circuit diagram of prior art NAND type output buffer circuit.
Figure 3B:
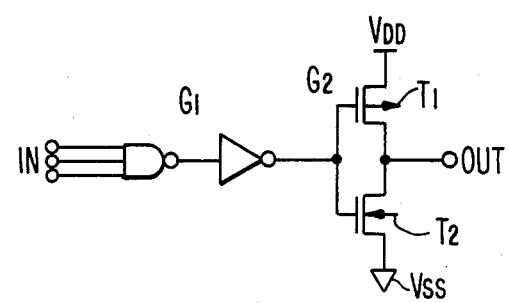
Figure 4A:
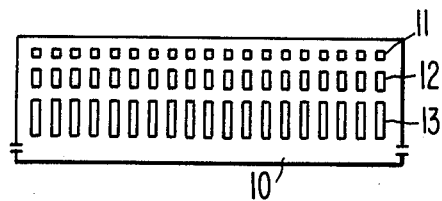
FIG. 4 illustrates a construction and wiring connection of output buffer circuit utilizing master slice technology. (Prior art)
Figure 4B:
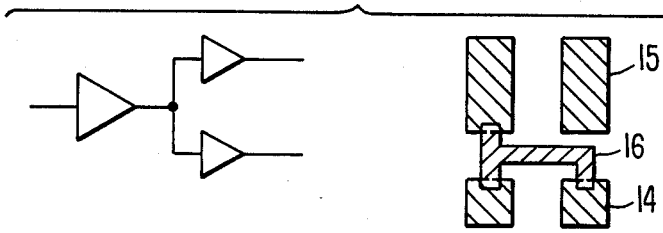
Figure 4C:
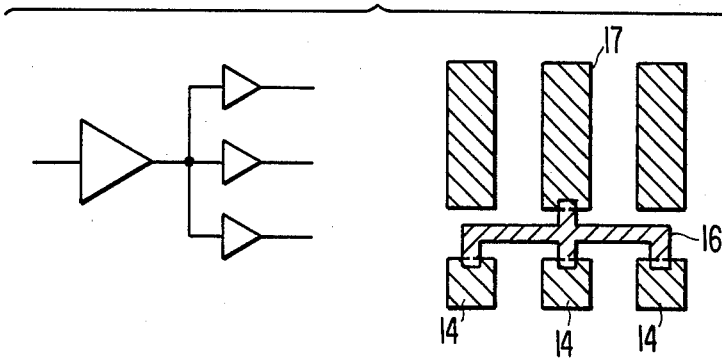
Figure 5:
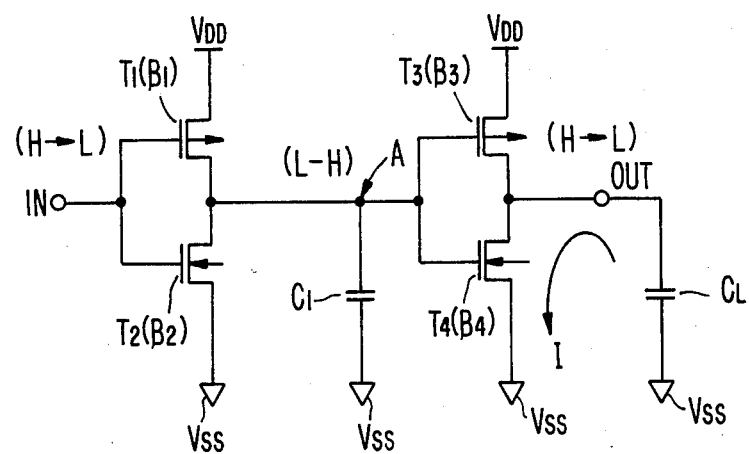
FIG. 5 is a circuit diagram of prior art non-inverting output buffer circuit.

FIG. 5 shows a circuit diagram of exemplar noninverting output buffer circuit. The circuit uses two pairs of CMIS FETs $T_1$, $T_2$ and $T_3$, $T_4$. $T_1$ and $T_3$ are p-channel FETs, and $T_2$ and $T_4$ are n-channel FETs. Each CMIS composes an inverter, and they are operationally connected in series, so altogether they work as non-inverting type circuit. In the figure, IN designates an input terminal connected commonly to gates electrodes of FETs $T_1$ and $T_2$. Drain electrode of $T_1$ and source electrode of $T_2$ are connected each other, and they are connected to gates electrodes of second stage inverter $T_3$ and $T_4$. The drain electrode of $T_3$ and source electrode of $T_4$ are connected each other and provide output to an output terminal OUT. Source electrodes of $T_1$ and $T_3$ are connected to positive voltage source $V_{DD}$, and drain electrodes of $T_2$ and $T_4$ are connected to lower voltage source $V_{SS}$ (usually it is ground). $C_1$ is a stray capacitance of the wiring circuit and gate electrodes of $T_3$ and $T_4$. $C_L$ is a stray capacitance of load including the wiring circuit.

When the input signal is varied from high level (H) to low level (L), potential at the node point A in FIG. 5 varies from L to H. Then the n-channel FET $T_4$ becomes conductive (ON), and p-channel FET $T_3$ becomes non conductive (OFF). So, the charge stored in the load capacitance $C_L$ is discharged through the FET $T_4$, and the output signal varies from H to L.

FIG. 6 shows waveforms which appears at this instant at several points in the circuit of FIG. 5. In the figure, curves (a), (b) and (c) shows respectively, the voltage waveform (V) of output terminal OUT, the current waveforms of transient current (I) running through the FET $T_4$ and the noise voltage ($V_N$) induced in $V_{SS}$ line.

In FIG. 6(a), a curve 1 shows a waveform of input signal applied at the node point A (that is $V_{GS}$ of output FET $T_4$) illustrating the building up of the signal. A curve 2 shows a waveform of output voltage, when the load capacitance $C_L$ is very small. A curve 4 shows the output voltage waveform when the load capacitance is very large, and a curve 3 shows the output voltage waveform when the load capacitance is intermediate between the curve 1 and 4. As can be seen in the figures, the output voltage begins to drop as soon as the input voltage (curve 1) exceeded the lower threshold voltage $V_{th}$, and the FET $T_4$ becomes to flow current. In the case of curve 2, the output voltage goes down very rapidly and the charge stored in the output capacitance is almost discharged before the input voltage rises up sufficiently and before the current increases to saturation current, because the load capacitance $C_L$ is very small. But in the case of the curve 4, the output voltage goes down slowly, so the input voltage goes up to the source voltage $V_{DD}$ (5 volt for example), and the FET $T_4$ becomes sufficiently ON. So in the FET $T_4$ runs its saturation current. The case of the curve 3 corresponds to the intermediate state among these two cases.

FIG. 6(b) shows current waveforms running through the FET $T_4$. The curves 5, 6 and 7 correspond respectively to the cases of curve 2, 3 and 4 in FIG. 6(a). The current begins to flow as soon as the input voltage (curve 1) exceeds the threshold voltage $V_{th}$. When the load capacitance is small (curve 5), the charge is discharged soon with a small maximum current. When the load capacitance is very large (curve 7), the current goes up to the saturation current, and then goes down slowly. Curve 6 is the intermediate case.

FIG. 6(c) illustrates voltage induced by the currents running through the FET $T_4$ which is shown in FIG. 6(b). This corresponds to the switching noise $V_N$. The curves 8, 9 and 10 corresponds respectively to the cases of curves 2, 3 and 4 in FIG. 6(a). It will be easily understood for the one skilled in the art that the induced voltage is proportional to the time derivative of the current (dI/dt), that is the transient current running through the output FET. Therefore if it is intended to decrease the switching noise, it is necessary to reduce the peak values of the curves 8, 9 and 10 in FIG. 6(a). It should be pointed out that the noise voltage appears both positive and negative side of the voltage, and as can be seen in the figure, the peak value of the noise almost does not vary so much for each curves, namely the noise does not depends on the load capacitance. This means that the buildup of the current in the FET $T_4$ is determined by the voltage buildup (curve 1) in the input side (node A) of $T_4$. If it is intended therefore, to suppress the noise, it is necessary to blunt the waveform of the current.

Generally, the ground line ($V_{SS}$ line) of LSI is made from aluminum or gold, and has resistance R and inductance L. Precisely, they can be divided as $R_1$, $R_2$ and $L_1$, $L_2$ respectively. The suffix 1 designates the value for the line in the LSI chip, and suffix 2 designates the value for the line from the chip to the pin of the package (Usually, $R_1 < R_2$ and $L_1 < L_2$). Therefore, If high current runs through the $V_{SS}$ line, the ground potential of the LSI chip varies, and causes malfunctions of logic circuits. The variation of the ground level, or the noise $V_N$ can be expressed as $$V_N \propto RI + L[(dI)/(dt)] \tag{1}$$

where $L = L_1 + L_2$, and $R = R_1 + R_2$

Among these equations, R is less than $0.1\Omega$, and it can be more decreased by making the $V_{SS}$ line thick or increasing the number of $V_{SS}$ pin and using them in parallel, so the effect of R can be eliminated. Therefore the noise appears in the $V_{SS}$ line is mainly depends on the variation of current dI/dt in the $V_{SS}$ line.

This noise is induced on other pins of the package and causes malfunctions of inner logic circuit, external load equipments or circuits. Especially for VLSI circuit, since the number of output buffer circuit increase, there occurs a chance that many of them operates at the same instant, and many switching currents rushes on the $V_{SS}$ line at the same time, and increases the noise.

FIG. 7 shows a relation between drain current $I_{DS}$ and the drain voltage $V_{DS}$ for various gate voltage $V_{GS}$ of FET. As known widely, the drain current $I_{DS}$ has a saturation region SAT and a non saturation region NON-SAT. And the saturation current varies depending on the gate voltage $V_{GS}$. In the figure, the curves 5 and 7 are superposed which indicate the trajectory of drain voltage of output FET $T_4$, corresponding to the curves 5 and 7 in FIG. 6(b).

Concerning the curve 5, the switching action starts from the point D where the current $I_{DS}$ is 0, and the voltage is $V_{DD}$. As the gate voltage $V_{GS}$ (input voltage) goes up, the current $I_{DS}$ begins to flow, at the same time the voltage $V_{DS}$ (output voltage) goes down since the load capacitance is discharged through $T_4$. Since the load capacitance is small, the voltage drops rapidly, even the current $I_{DS}$ is small.

Concerning the curve 7 of FIG. 7, the switching action starts from the point D similarly to the curve 5, but since the load capacitance is very large, the drain voltage goes down slowly, and as the gate voltage $V_{GS}$ goes up, the current $I_{DS}$ increases. And after passing a maximum current which determined by $V_{CC}$ and $V_{GS}$, (this is a saturation current, since $V_{GS} > V_{th}$) the current does down. It should be pointed out, that the inclination of the curves 5 and 7 do not indicate the steepness of the current build-up, because the horizontal axis of FIG. 7 is not indicating time but the drain voltage $V_{DS}$.

As can be seen in FIG. 7, when the FET is operating in the saturation region, the transient current running through the output FET depends on the load capacitance and the gate voltage. But when the FET is operating in the non-saturation region, it does not depend on the load capacitance. It is known that when the FET is operating in saturation region, the current I running through the FET is given as $$I \propto \beta \cdot (V_{GS} - V_{th})^2 \tag{2}$$

So the derivative of the current dI/dt is obtained by differentiating the equation (2) by t, $$\frac{dI}{dt} \propto \beta \cdot (V_{GS} - V_{th}) \cdot \frac{dV_{GS}}{dt} \propto \sqrt{\beta} \cdot \sqrt{I} \cdot \frac{dV_{GS}}{dt} \tag{3}$$

here, $\beta$ is the current amplification factor, $V_{GS}$ is the gate voltage and $V_{th}$ is the threshold voltage.

As mentioned before, the switching noise depends on the inductance L and the transient current dI/dt running through the output FET. But it is difficult to control the transient current on the output side of the buffer FET, since the current varies with the load capacitance. Taking into account the fact that the transient current depends on the input signal level $V_{GS}$ of the output FET, the present invention intends to decrease the noise due to the switching current, by varying the input signal of the output FET slowly. As mentioned before, this is a perfectly opposite design concept of the LSI circuit compared to that of prior art. By doing so, the switching speed is slightly affected, but it is not serious, but the noise is reduced drastically.

Above situation can be explained as follows. The curves 5 and 7 in FIG. 7 can be considered to correspond respectively to large $\beta$ and small $\beta$ FET, having the same load capacitance. So the switching speed is determined by the $\beta$ or load capacitance of the final stage FET. In such a manner, the switching speed of a circuit is mainly determined by the switching speed of the final stage FET.

Generally the final stage output FET is made as large as possible and its $\beta$ as high as possible, but usually the switching speed of the output buffer circuit is still lower than that of its input driving buffer circuit, even though the $\beta$ or current flow is large. In other words the switching speed of the output buffer circuit is slower than that of the driving buffer circuit. In the present invention, the final stage FET is not altered from the prior one, so the driving capacity and switching speed of the output FET is not altered, but its input waveform is blunted, so the current build-up in the output FET is blunted, keeping its maximum current unaltered.

Figure 8A:
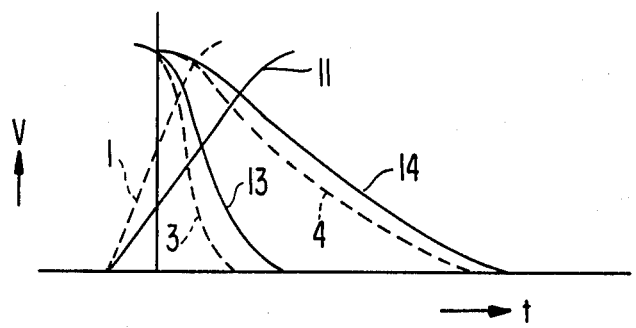
FIG. 8 shows voltage and current waveforms corresponding to the curves of FIG. 6, comparing the improved waveforms by the present invention to them of the prior art.
Figure 8B:
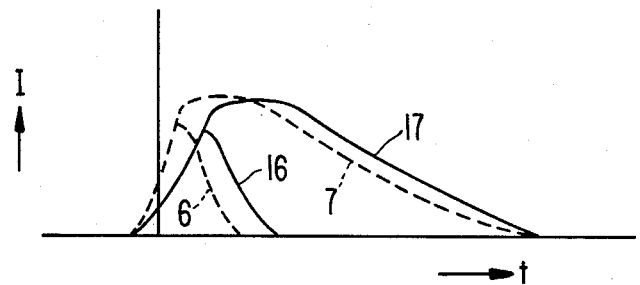
Figure 8C:
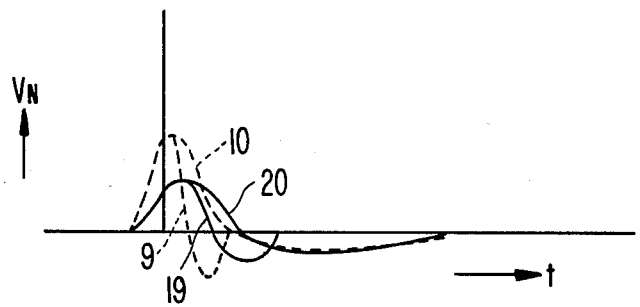

FIG. 8 shows the curves corresponding to that of FIG. 6, wherein FIG. 8(a) shows voltage waveforms of the input and output of the buffer circuits, FIG. 8(b) shows the current waveforms running through the FET, and FIG. 8(c) shows the noise voltage $V_N$ which appears in $V_{SS}$ line when the FET is switched ON and OFF. The figures show these values comparing when the input signal is blunted (solid lines) to those values when the input signal is not blunted (broken lines). The broken lines having the same index numerals show the same curves given in FIG. 6.

When the input signal is blunted slightly, for example the slope of the input signal 11 is blunted to the half of that of the curve 1, the output current waveform 3 which corresponds to a medium load capacitance will be blunted to the curve 13. By this blunting the output current 6 will be blunted to the curve 16, which has half steepness of the build-up curve, because the build-up is in the saturation condition of FET and the current is determined by the gate voltage (input voltage) of the FET. So the noise voltage decreases from the curve 9 to the curve 19, whose peak value is reduced to the half.

If the load capacitance is very large which is indicated by the curve 4 will vary to the curve 14. In this case the variation of curve is not so much, because the FET is saturated and the current is determined almost by the load capacitance and the saturation current of the FET. The current variation in the FET is shifted from the curve 7 to the curve 17. So the noise voltage decreases from the curve 10 to the curve 20. Since the build-up current is the same for all of these cases, the noise voltage corresponding the the build-up is almost the same, but the noise corresponding to the build-down current is much lower. In any way the noise voltage is decreased by half of that of the initial case. And it will be seen in the figures, the switching time does not increase twice of the initial value, especially when the load capacitance is large the loss of the switching time is small.

In general case, the switching action of the output buffer circuit corresponds to that of the curve 4, and the switching action of the driving buffer circuit or its input signal correspond to the curves 3 or 2 in FIG. 6. Therefore the present invention intends to blunt the input signal for the output buffer circuit, and reduce the noise without losing the switching speed so much.

Figure 9:
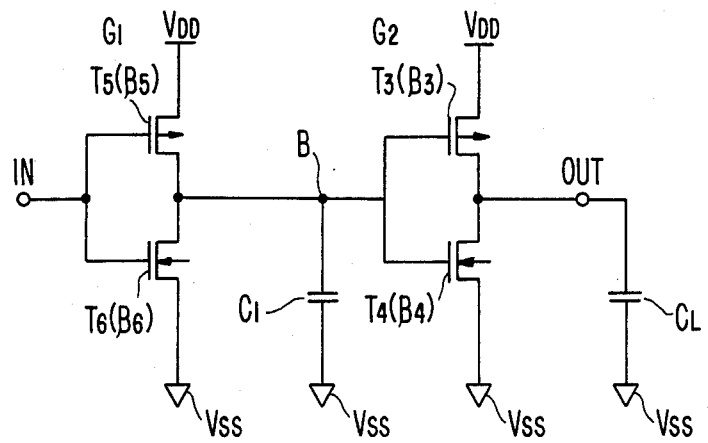
FIG. 9 shows circuit diagram of output buffer circuit according to the present invention.

FIG. 9 shows a circuit diagram of an output buffer circuit by the present invention. The circuit uses two pairs of CMIS FETs $T_5$, $T_6$ and $T_3$, $T_4$. The transistors $T_5$ and $T_3$ are p-channel FETs, and $T_6$ and $T_4$ are n-channel FETs. Each CMIS composes an inverter, and they are operationally connected in series, so altogether they works as non-inverting type circuit. In the figure, IN designates an input terminal connected commonly to gates electrodes of FETs $T_5$ and $T_6$. Drain electrode of $T_5$ and source electrode of $T_6$ are connected each other, and they are connected commonly to gates electrodes of second stage inverter $T_3$ and $T_4$. The drain electrode of $T_3$ and source electrode of $T_4$ are connected each other and provide output signal to the output terminal OUT.

Unlike to the prior circuit of FIG. 5, $\beta$ of the FETs $T_5$ and $T_6$ are adjusted, the other part is not altered. Therefore the switching time and switching capacity of the $T_3$ and $T_4$ are not altered, but the switching speed of the driving buffer circuit ($T_5$ and $T_6$) is adjusted. Usually the adjustment of the current waveform at its output side of FET is difficult, because the load varies so often, but in one aspect of the present invention, the load of the driving buffer FETs $T_5$ and $T_6$ is always constant (the gate circuits of the output buffer circuit $T_3$ and $T_4$), therefore the input waveform to $T_3$ and $T_4$ is varied by varying the $\beta$ of the driving FET $T_5$ and $T_6$. For example, if $\beta$ of $T_5$ is made to the half of the prior circuit ($T_1$), that is $\beta_5 = \frac{1}{2}\beta_1$, the current of the driving buffer circuit becomes $\frac{1}{2}$, accordingly the waveform at point B is blunted, and the transient current dI/dt of the driving buffer circuit or the switching noise is reduced to approximately to the half of the previous value.

In the above explanation the noise on the $V_{SS}$ side has been described, but it is similar to the noise induced at $V_{DD}$ side, in this case the comparison of $\beta_6$ of $T_6$ to that of $T_2$ will lead to the same results.

As mentioned before, $\beta$ is varied by varying the ratio of gate width W and gate length L (W/L). Of course, the adjustment of the ratio W/L can be performed in a design stage of the chip, but since the adjustment is not critical, so it can be adjusted using a master slice technology. The details will be described referring some embodiments.

FIG. 10(a) shows schematically a plan view of a gate array LSI chip by the present invention. In the figure, 20 designates the chip, on which the inner logic circuit (main logic circuits) 23 is fabricated at the center part of the chip. Details of the mail logic circuit are omitted in the figure. On the peripheral part of the chip 20 are fabricated bonding pads 21, which is connected to the package by bonding wires (not shown). Between the bonding pads 21 and the inner logic circuits 23 are located I/O (input/output) circuits 22, which handles high current and includes the circuit by the present invention. Blank area of the chip are used for wiring between the circuits, but they are omitted from the figures for the sake of simplicity.

Figure 10B:
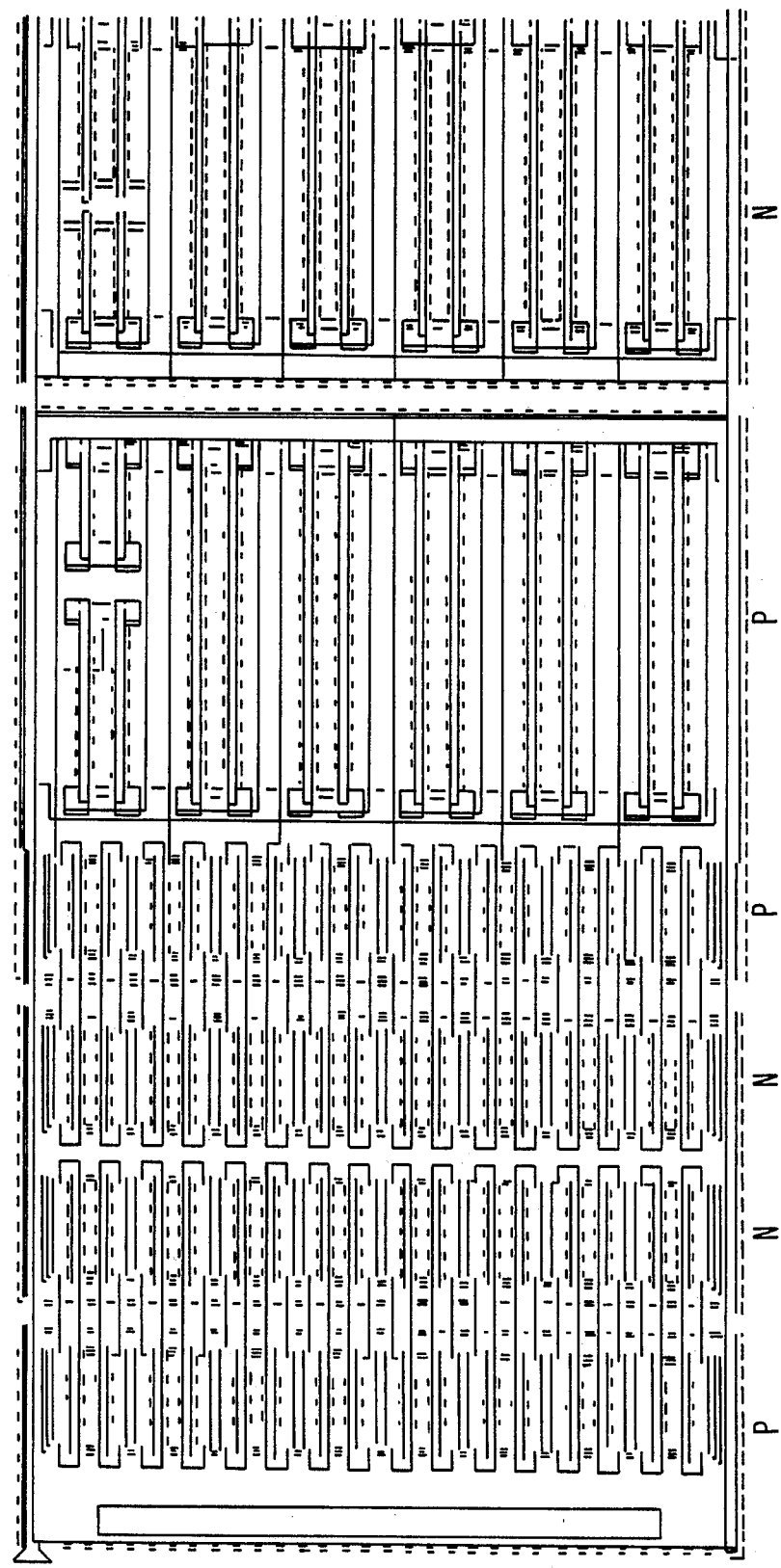
FIG. 10 shows plan view of a chip by the present invention, wherein:
 (a) is a schematic plan view of a chip; and
 (b) is an enlarged plan view showing a part of I/O area.

FIG. 10(b) is a magnified plan view of the portion for the I/O circuits 22 on the chip of FIG. 10(a), indicating patterns of small and large sized FETs. On the left hand side of the figure are arranged small size FETs, and on the right hand side are arranged large size FETs, there are also included p-channel and n-channel FETs. They are arranged in rows and columns as shown in the figure, for the sake of design and fabrication convenience. In the figure, the columns of the p-channel and n-channel FETs are designated by symbols of P and N respectively.

FIG. 10 shows a general pattern arrangement, accordingly there may be many modifications and variations within the spirit of the invention. For example, intermediate size transistors may be included to meet the circuit design. In FIG. 10(b), an example of the intermediate size FETs are shown on the first row of right side columns. Control of $\beta$ or adjustment of driving current, is performed by selection of the size of FET and wiring them like a manner of designing a master slice chip.

By using such master slice, it is unnecessary to design the chip from the beginning of the fabrication process. It can meet for various kinds of requirement by using a same patterned chip prepared before hand. For example, in order to driving a heavy load, the large FETs are used in parallel to construct the output buffer circuit. And for constructing a driving buffer circuit, preferable number and size of FETs are selected within the spirit of the present invention. They can be wired for any buffer circuit only by varying the wiring pattern.

FIG. 11 shows an embodiment of a driving gate circuit, which can vary its driving capacity ($\beta$ or maximum current) by varying its wiring pattern. FIG. 11, (a) is a plan view of the gate circuit schematically sowing its pattern appearing on the chip surface, (b) and (c) shows its cross sectional view at the lines AA and BB respectively showing a bulk structure of a p-channel FETs and n-channel FETs, and (d) is its equivalent circuit diagram.

In these figures, 1 designates an n-type silicon substrate, 2 is a p-type well fabricated in it. The p-channel FETs $T_{5a}$, $T_{5b}$ are fabricated on the upper part of the FIG. 11(a), and n-channel FETs $T_{6a}$, $T_{6b}$ are fabricated in the lower part of the FIG. 11(a). Reference numeral 3 designates a field oxide layer, which separates the devices and wiring is made on it. 4 is a gate oxide film, and gate electrodes 5a (first gate) 5b (second gate) are fabricated on it. Concerning the p-channel FETS, 6 is a $p^+$-type common drain region for the p-channel FETs, and 7a and 7b are first and second $p^+$-type source regions. Concerning the n-channel FETs, 8 is an $n^+$-type common drain region, 9a and 9b are respectively first and second $n^+$-type source regions. As can be seen in the figure, the gate electrodes of the $T_{5a}$ and $T_{6a}$ are connected each other by the first gate 5a, and commonly connected to the first input terminal IN1, and the gate electrodes of the $T_{5b}$ and $T_{6b}$ are connected each other by the second gate 5b, and commonly connected to the second input terminal IN2. Thus they compose complementary circuit aligned in parallel each other.

Structure and fabrication process for such chips are quite common in the art so the detail is omitted. The gate width of the FETs in FIG. 10 are designed to be half of them of the driving FETs in previous figures ($T_1$ and $T_2$). Therefore, if the FETs of FIG. 11 are used for the driving gate, the input signal to the output FET is blunted compared to that of previous figures. Varying the connection of these FETs it is possible to realize various kinds of output circuit having low switching noise.

Figure 12A:
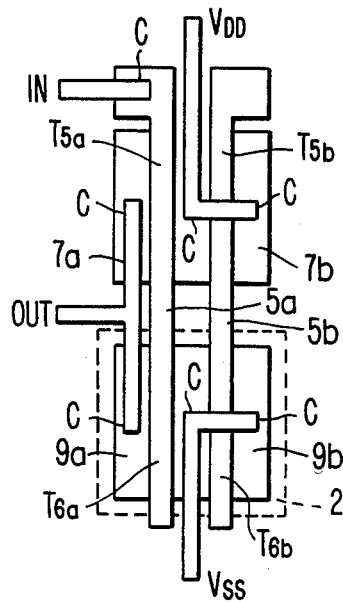
FIG. 12 shows an embodiment of the wiring for pattern of FIG. 11(a), to decrease the driving capacity of the circuit to the half of the previous one, wherein:
 (a) shows a plan view of the device illustrating its wiring pattern; and
 (b) shows its equivalent circuit diagram.
Figure 12B:
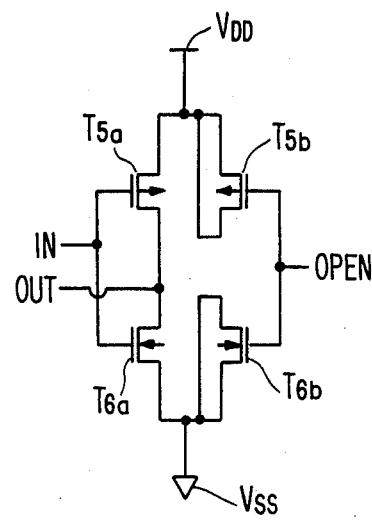

FIG. 12 shows an embodiment of wiring using the circuit pattern of FIG. 11. Figure shows a connection of the pattern for realizing a circuit having a half driving capacity (driving current). FIG. 12(a) shows schematically the wiring pattern, and FIG. 12(b) shows its equivalent circuit diagram. In this case only the half part (left side) of the pattern is used. In the figure, heavy lines show the wiring pattern, and points Cs designates a point where the wiring should be contacted to the electrode. Contact is made directly to the electrode, or through a contact hole made in the insulation layer covering the surface of the electrodes. Such wiring is also conventional in the art.

In FIG. 12, one of the common gate (IN1) is used for input IN, and the first $n^+$-type region 7a and the first $p^+$-type region 9a are connected each other, so the FETs $T_{5a}$ and $T_{6a}$ are connected in series between $V_{DD}$ and $V_{SS}$. The right half of the pattern are not used, so the source and drain electrodes of FETs $T_{5b}$ and $T_{6b}$ are shorted each other. If the circuit of FIG. 12 is used for the driving of the output buffer circuit, the input signal for the output buffer circuit is blunted, since the gate width of the FETs $T_{5a}$ and $T_{6a}$ are decreased to the half of them of $T_1$ and $T_2$, and the noise is reduced.

Figure 13A:
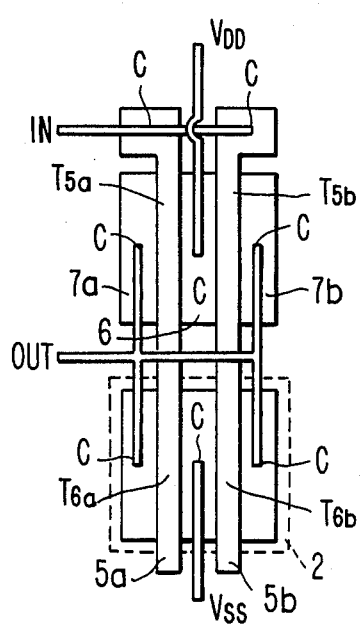
FIG. 13 shows another embodiment of the wiring for the pattern of FIG. 11(a), to provide the same driving capacity to that of previous one, wherein:
 (a) shows a plan view of the device illustrating its wiring pattern; and
 (b) shows its equivalent circuit diagram.
Figure 13B:
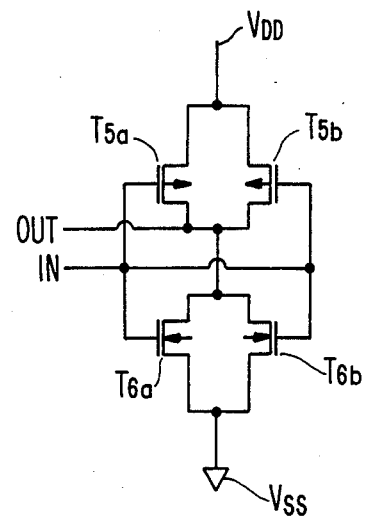
Figure 14A:
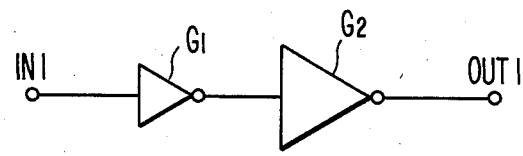
FIG. 14 shows symbolic diagram for typical output buffer circuits, illustrating how the driving capacity of the input and output buffer circuits are varied by combining unit circuits.
Figure 14B:
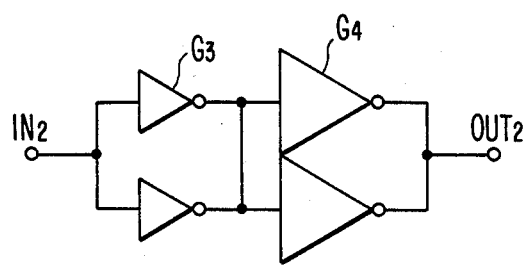
Figure 14C:
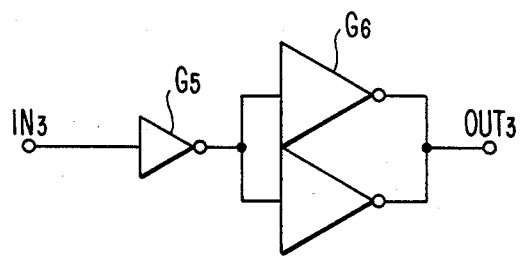
Figure 14D:
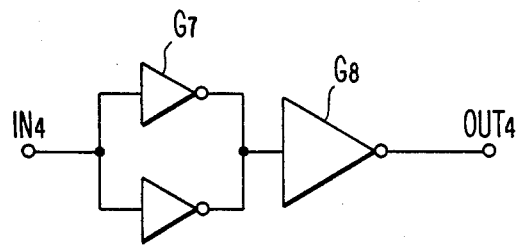

FIG. 13 shows another embodiment of the wiring for the pattern of FIG. 11, in which the driving current is increased to twice of that of FIG. 12 in order to drive a larger output circuit. FIG. 13(a) shows the wiring pattern and FIG. 13(b) shows its equivalent circuit diagram. In this embodiment the left and the right half of the pattern are used in parallel. In the figure, heavy lines indicate the wiring line, and the points Cs indicate the part where the wiring circuit should contact to the electrodes. It will be clear for the one skilled in the art that the pattern of (a) corresponds to the circuit of (b), and its driving capacity is doubled compared to the circuit of FIG. 12.

In the foregoing embodiments a circuit pattern having a common source or common drain FETs were used, but it is obvious that any pattern for the master slice can be used for the purpose of the present invention.

FIG. 14 shows by symbol mark several output circuits illustrating how the driving capacity of the input and output buffer circuits are varied by connecting the unit circuits in series or parallel, to compare the effect of the present invention. In the figures G designates buffer circuit, and IN and OUT designates respectively an input and output terminal of the circuit. And a larger symbol indicates a larger buffer circuit. FIG. 14 shows the case in which one or two input buffer circuits and output buffer circuits are combined. But it will be obvious for the one skilled in the art that, the number of the circuits to be combined may be extended for any numbers. So it should be considered that FIG. 14 shows only typical cases.

In the figure, (a) is a true type output circuit composed from two inverters, $G_1$ the driving buffer gate and $G_2$ the output buffer gate.

The circuit of (b) provides twice as high as driving capacity, which is composed from parallel circuit of (a). $G_3$ and $G_4$ corresponds respectively to $G_1$ and $G_2$. In this case the delay of the output signal is same to that of (a), but the noise is also doubled.

In the circuit of (c), the output buffer gate $G_6$ is twice to that of (a), so it has the same driving capacity to the circuit of (b). But the driving buffer circuit comprises only one circuit $G_5$ which corresponds to $G_1$ of the circuit (a). So, the delay time of signal becomes large compared to those of the circuits (a) or (b), but the noise is reduced to lower than that of (a). Generally the load connected to the output OUT3 has stray capacitance, so by the effect of the present invention the delay time of the signal does not increase so much compared to that of the circuit (b).

The circuit of (d), has twice driving capacity for the input buffer gate $G_7$, but the output buffer circuit $G_8$ has the same driving capacity to that of the circuit (a). This circuit has the highest switching speed, but it can not be twice of the circuit (a), because the switching time is almost determined by the switching speed of the output buffer circuit $G_8$. On the other hand the noise is almost twice to that of the circuit (a).

Table 1 summarizes the measured data of an experiment to proof the above consideration.

TABLE 1

| CIRCUIT TYPE | WITHOUT CAPACITANCE nS | LOAD CAPACITANCE | | | | | | NOISE AMPLITUDE V |
|---|---|---|---|---|---|---|---|---|
| | | 10 pF | | 100 pF | | 200 pF | | |
| | | DUE TO CAPACITANCE nS | TOTAL DELAY nS | DUE TO CAPACITANCE nS | TOTAL DELAY nS | DUE TO CAPACITANCE nS | TOTAL DELAY nS | |
| a | 9.5 | 1.0 | 10.5 | 10.0 | 19.5 | 20.0 | 29.5 | 1a |
| b | 9.5 | 0.5 | 10.0 | 5.0 | 15.0 | 10.0 | 19.5 | 2a |
| c | 11.5 | 0.5 | 12.0 | 5.0 | 16.5 | 10.0 | 21.5 | <1a |
| d | 7.5 | 1.0 | 8.5 | 10.0 | 17.5 | 20.0 | 27.5 | ~2a |

Each of the buffer circuit corresponding to the circuits (a), (b), (c) and (d) of FIG. 14 were composed from a standard master slice pattern. They were tested respectively for the case of no load capacitance and for the cases loaded by capacitors of 10 pF, 100 pF and 200 pF respectively. For each case, delay time and noise voltage were measured. In the table, the delay time is subdivided into the delay time due to the loaded capacitance and the total delay time. The former is obtained by subtracting the no load capacitance delay time from the total delay time. The noise voltage is given in relative values.

The measured values in the table confirm the above consideration of the present invention. For example:

the total delay time increases as the load capacitance increases, and it is mainly determined by the capacitance;

the no load delay time is equal for the circuits (a) and (b), and the delay time for the circuit (d) is shortest and for the circuit (c) is longest;

but they can not be half or twice of the delay time of (a) or (b) respectively;

to increase the driving capacity of the output buffer circuit has effect to reduce the delay time, but this effect is discounted by load capacitance;

on the contrary the noise increases almost proportionally to the driving capacity of the output circuit (compare a and b);

but the noise is reduced very much by reducing the driving capacity of the driving buffer circuit (compare a, b and c); and increasing the driving capacity of the driving buffer circuit has little effect on the delay time improvement, but it increases the noise very much.

As can be seen from these experiments, it is meaningless to increase so much the switching speed of the driving buffer circuit, moreover, it has serious defect on the noise. Of course it is important to increase the switching speed of main logic circuit and output buffer circuit in order to attain high speed of the device. But concerning the driving buffer circuit its switching speed or driving capacity should be controlled wisely from the stand point of switching noise.

Practically there must be optimum switching speed for the driving buffer circuit, which is determined by the load condition of the output buffer circuit. Generally speaking, the switching speed of the driving buffer circuit is preferable to be from two to five times as high as that of the output buffer circuit. If the ratio of the switching speed of the input to output buffer circuit becomes larger the noise increase, on the contrary if the ratio becomes smaller the circuit loses its switching speed.

As has been described above, prior art output buffer circuits are intended to increase the switching speed, and the consideration about its noise has never been done. Therefore, the switching speed of the driving circuit has been increased, but it does not improve the switching speed so much, moreover, it increases the problem of the switching noise. The present invention, on the contrary, intends to decrease the speed of the driving circuit intentionally, which does not increases the delay time of the signal so much and decreases the noise very much. This is obviously an opposite design concept to that of the prior art. But it is effective for an LSI circuit design. The switching speed can be adjusted by a master slice technology.

What is claimed are as follows:

1. A reduced switching noise semiconductor integrator circuit having a plurality of output buffer circuits and output terminals, each of said output buffer circuits comprising:

a plurality of final stages of said output buffer circuits connected to respective output terminals;

a plurality of driving buffer circuits having a current handling capacity smaller than the current handling capacity of the output buffer circuits, operatively connectable to said final stages, for driving said final stages, the switching speed of said driving buffer circuits being controlled to be in the range of three to five times the switching speed of said output buffer circuits, for blunting the input waveform of said output buffer circuits and for reducing noise in the circuit caused by current variation in said output buffer circuits; and wiring means, operatively connected between said final stages and said driving buffer circuits, for connecting selected ones of said driving buffer circuits, at least one of said output buffer circuits utilizing one or more of said driving buffer circuits, the number of driving buffer circuits being less than the number of said final stages in said at least one of said output buffer circuits.

2. A semiconductor integrated circuit according to claim 1, wherein said final stages of said output buffer circuits include a predetermined number of transistors operatively connected in parallel, and wherein said driving buffer circuits include a plurality of transistors, the number of said plurality of transistors in said driving buffer circuits is less than said predetermined number of transistors in said final stages of said output buffer circuits.

3. A semiconductor integrated circuit according to claim 1, wherein said output buffer circuit is operated in a circuit current saturation region of a CMOS transistor, and wherein the input waveform of said output buffer circuit is blunted so as to blunt the current built up in said output buffer circuit.

4. A semiconductor integrated circuit according to claim 1, wherein said output buffer circuits and said driving buffer circuits are formed from FETs having different sizes.

5. A semiconductor integrated circuit according to claim 1, wherein said driving buffer circuits comprise field effect transistors (FETs) and said output buffer circuits comprise FETs, the number of FETs forming said driving buffer circuits being less than the number of FETs forming said output buffer circuits.

* * * * *